United States Patent [19]

Morita

[11] Patent Number: 5,410,509

[45] Date of Patent: Apr. 25, 1995

[54] DYNAMIC TYPE SEMICONDUCTOR MEMORY DEVICE WITH DUMMY CELLS CAPABLE OF ACCURATELY READING INFORMATION FROM MEMORY CELL ARRAY

[75] Inventor: Shigeru Morita, Kawasaki, Japan

[73] Assignee: Kabushiki Kaisha Toshiba, Kawasaki, Japan

[21] Appl. No.: 711,139

[22] Filed: Jun. 6, 1991

[30] Foreign Application Priority Data

Jun. 7, 1990 [JP] Japan .................. 2-147488

[51] Int. Cl.⁶ .............................. G11C 11/34
[52] U.S. Cl. ..................... 365/210; 365/149
[58] Field of Search ................. 365/210, 149

[56] References Cited

U.S. PATENT DOCUMENTS

| 4,117,545 | 9/1978 | Inadachi | 365/210 X |
| 4,380,803 | 4/1983 | Tuan | 365/149 X |
| 4,799,196 | 1/1989 | Takemae | 365/149 X |

FOREIGN PATENT DOCUMENTS

| 56-13590 | 2/1981 | Japan | 365/210 |
| 64-69049 | 3/1989 | Japan. | |

Primary Examiner—Joseph A. Popek
Attorney, Agent, or Firm—Finnegan, Henderson, Farabow & Garrett & Dunner

[57] ABSTRACT

A dynamic type semiconductor memory device comprises a semiconductor substrate including a memory cell array, the memory cell array including two kinds of main memory cells and two kinds of dummy cells, a plurality of bit lines disposed above the semiconductor substrate and generally extending in a first direction, a plurality of word lines disposed above the semiconductor substrate and generally extending in a second direction so as to intersect the bit lines, and dummy word lines disposed above the semiconductor substrate and generally extending in the second direction so as to intersect the bit lines. In this case the main memory cells and the dummy cells are connected to the bit lines, the word lines and the dummy word lines, respectively, in such a manner that one of the main memory cells and one of the dummy cells each having the same kind are selected when any one of the main memory cells is selected. As one kind of the main memory cells, trench capacitor type memory cells are used, while stacked capacitor type memory cells are employed as the other kind of the main memory cells.

10 Claims, 8 Drawing Sheets

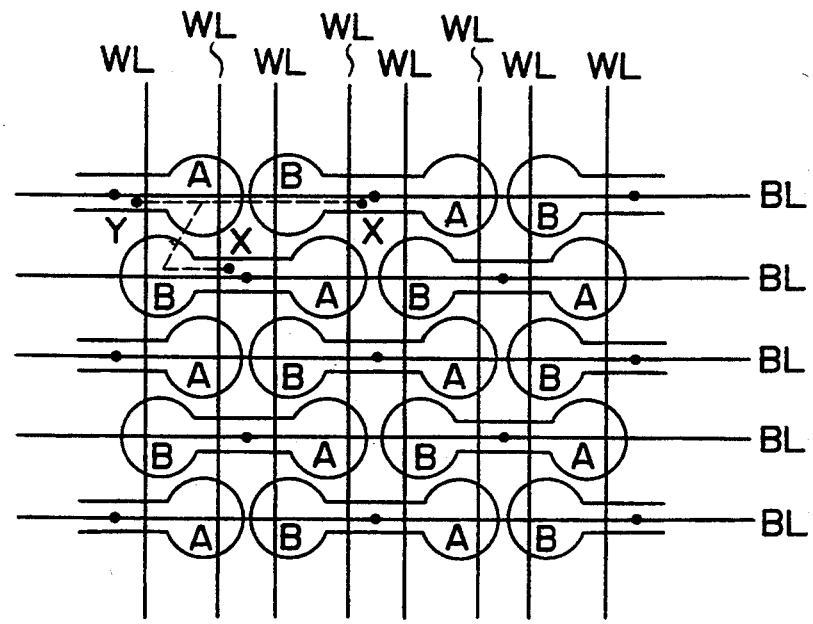
F I G. 2
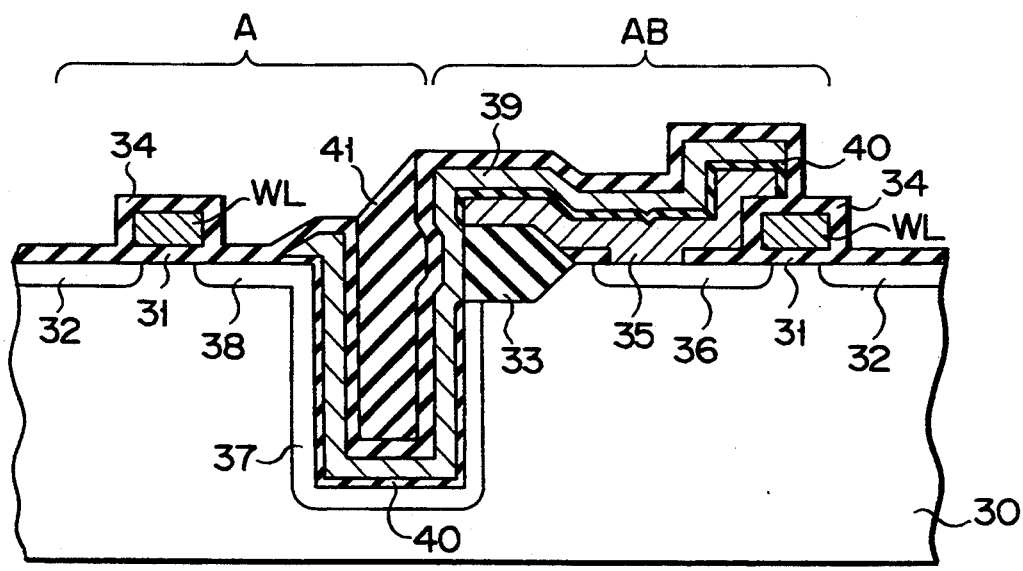
F I G. 3

DYNAMIC TYPE SEMICONDUCTOR MEMORY DEVICE WITH DUMMY CELLS CAPABLE OF ACCURATELY READING INFORMATION FROM MEMORY CELL ARRAY

BACKGROUND OF THE INVENTION

1. Field of the Invention

The present invention relates to a dynamic type semiconductor memory device, and more particularly to, a dynamic type semiconductor memory device including dummy cells capable of accurately reading information from a memory cell array.

2. Description of the Related Art

FIG. 6 shows an equivalent circuit of a memory cell of a dynamic type random access memory device (DRAM). In the equivalent circuit shown, reference numerals 61 and 62 show a MOS transistor for transfer gate and a capacitor for information storage, respectively. The MOS transistor 61 has a drain connected to a bit line 63, a gate connected to a word line 64 and a source connected to one terminal of the capacitor 62. The other terminal of the capacitor is connected to a predetermined potential.

In the dynamic type memory cell, a voltage is applied to the bit line 63 and word line 64 at a time of writing to turn the transistor 61 ON. When this occurs, an electric charge moves through the bit line 63 to the capacitor 62 where it is stored. At a time of reading, a voltage is applied to the word line 64 to allow the electric charge to be released via the transistor 61.

Thus, the performance of the memory cell is substantially determined by the characteristics of the transistor 61 and the capacitor 62. In order to retain the electric charge in good condition, it is necessary to suppress the leak level of the charge, but it is important that a quantity of charge stored in the capacitor 62 be increased.

On a cross-sectional structure of a conventional dynamic memory cell, two memory cells adjacent to each other will be described.

FIG. 7 shows the cross-sectional structure of a planar capacitor type memory cell array having a charge storage region in a surface of a semiconductor substrate. That is, an isolation region 72 is selectively provided in, for example, a P-type semiconductor substrate 71. A source region 73 and a drain region 74 for a transfer gate transistor, which are comprised of an opposite conductivity type diffused layer (N+-type), are provided in the isolated substrate 71. A charge storage region 75 is formed in the substrate so as to be continuous with the source region 73 and serves as one electrode of capacitor. An electrode plate 77 is provided above the substrate through an insulating film 76. The electrode plate 77 serves as the other electrode of the capacitor. A gate electrode (word line) 79 for the transfer gate transistor is provided between the source region 73 and the drain region 74 through a gate insulating film 78. A bit line, not shown, is in contact with the drain region 74.

Recently, with demand for high density DRAMs, there have been used a trench capacitor type memory cell as shown in FIG. 8 and a stocked capacitor type memory cell as shown in FIG. 9. In the trench capacitor type memory cell as shown in FIG. 8, a charge storage region 83 is provided in an inner surface of a trench 82 formed in a semiconductor substrate 81. The charge storage region 83 is formed of a diffused layer whose conductivity type is opposite to the semiconductor substrate. In the structure, the other parts or portions of the memory cell are the same as those shown in FIG. 7 and are shown with identical reference numerals used for them. In the stacked capacitor type memory cell shown in FIG. 9, a charge storage region 92 of polysilicon is provided above a gate electrode (word line) 79, an isolation region 72, etc., through an interlevel insulator 91, and is in contact with a source region 73. The other parts or portions of the memory cell are the same as those shown in FIG. 7 with identical reference numericals employed for them.

In the trench and stacked capacitor type memory cells, it is possible to provide a charge storage region having the same area on the reduced substrate surface area, as compared to the planar capacitor type memory cell. In relation to the memory capacitance, a memory cell having the same storage performance can be provided on a smaller substrate surface area, assuring a high density memory cell array.

In a conventional DRAM memory cell array, memory cells of the same type are adjacently arranged on a substrate so as to provide a matrix of memory cells as schematically shown in FIG. 10. Considering both electrical connections among memory cells and common bit and word lines BL, WL and the high density arrangement, memory cells may be located in such a manner that their capacitor (each charge storage region is marked with "C") of adjacent memory cells are arranged in close proximity. In FIG. 10. a transfer gate transistor and a contact between the drain of the transfer gate transistor and the bit line BL are represented by "G" and "•" respectively.

The high density of the conventional memory cell array has been achieved by primarily modifying a memory cell array structure, but there has been required for an increasing demand for a higher integration density structure and hence a memory cell array structure with memory cells arranged more closely adjacent one another. Since, in the conventional memory cell array, the adjacent capacitors of the memory cells are adjacent to each other as described above, charge storage regions formed above a common substrate or a common conductive film may be arranged in proximity. In the memory cell array, it may be a key to reduce the distance between memory cells, that is, to locate the charge storage regions in close proximity.

Depending upon the limit of finely patterning a film as well as mutual transfer of the charge (destruction of stored data) caused by a proximity effect between the charge storage regions, the distance between the charge storage regions is given by at least 0.5 $\mu$m or more. That is, a limited condition may occur against the arrangement of the memory cells, thereby interrupting the increase in the integration density of the memory cell array. In this case, "the limit of finely patterning the film" means a minimum dimension capable of patterning a single film. The "proximity effect" between the charge storage regions represents an action of electric charge which passes through the substrate in the planar and trench capacitor type memory cells and through the interlevel insulator in the stacked capacitor type memory cells to move between charge storage regions. The effect is prominent for the trench capacitor type memory cell in particular.

A DRAM for satisfying the aforementioned requirement has already been proposed by Japanese Patent Application No. 62-227307 (Published Unexamined Japanese Patent Application No. 64-69049). As shown in FIG. 11 or 12, the memory cell array of the DRAM includes first memory cells (marked with "o") each having a shallow diffusion layer as a cell node and second memory cells (marked with "x") each having a deep diffusion layer as a cell node. These first and second memory cells are arranged in such a manner that the cell nodes of the second memory cells are not adjacent to each other through a field insulating film. In this case, the memory cells are arranged on the substrate to provide a matrix. However, in the memory cell array shown in FIG. 11, different kinds of memory cells are alternately arranged in a direction of a common bit line BL. In FIG. 11, WL represents a direction of a word line, and CT represents a contact between the bit line and a memory cell transistor, respectively.

According to the arrangement, since leak current in a pseudo MOS transistor, which uses the field insulating film as a gate insulating film, is small, it is possible to arrange the adjacent memory cells in proximity. Therefore, the integration density of such a memory cell array can be increased because the occupation of the cell area is made small which is a feature of the second memory cells.

In the case where different kinds of memory cells are connected to the common bit line, the bit line potentials may be different from each other when the same data is read from the first and second memory cells connected to the same bit line, because they have the different capacitance values due to the different charge storage regions. Accordingly, when the data is read from the different memory cells, it cannot be possible to accurately detect the information.

SUMMARY OF THE INVENTION

It is accordingly an object of the present invention to provide a dynamic type semiconductor memory device which can accurately detect information when it is read out from different kinds of memory cells of a memory cell array.

Another object of the present invention is to provide a dynamic type semiconductor memory which can arrange memory cells in proximity and can simplify a dummy cell selection circuit.

According to an aspect of the present invention, there is provided a dynamic type semiconductor memory device, which comprises a semiconductor substrate including a memory cell array, the memory cell array including two kinds of main memory cells and two kinds of dummy cells, a plurality of bit lines disposed above the semiconductor substrate and generally extending in a first direction, a plurality of word lines disposed above the semiconductor substrate and generally extending in a second direction so as to intersect the bit lines, and two dummy word lines disposed above the semiconductor substrate and generally extending in the second direction so as to intersect the bit lines. In this case the main memory cells and the dummy cells are connected to the bit lines, the word lines and the dummy word lines in such a manner that one of the main memory cells and one of the dummy cells each having the same kind are selected when any one of the main memory cells is selected. As one kind of the main memory cells, trench capacitor type memory cells are used, while stacked capacitor type memory cells are employed as the other kind of the main memory cells.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 2 is a view schematically showing a part of a plane pattern of the memory cell array shown in FIG. 1A;

FIG. 3 is a cross-sectional view taken along line Y-X in FIG. 2;

DETAILED DESCRIPTION OF THE PREFERRED EMBODIMENTS

The embodiments of the present invention will be described below with reference to the accompanying drawings.

Figure 1A:
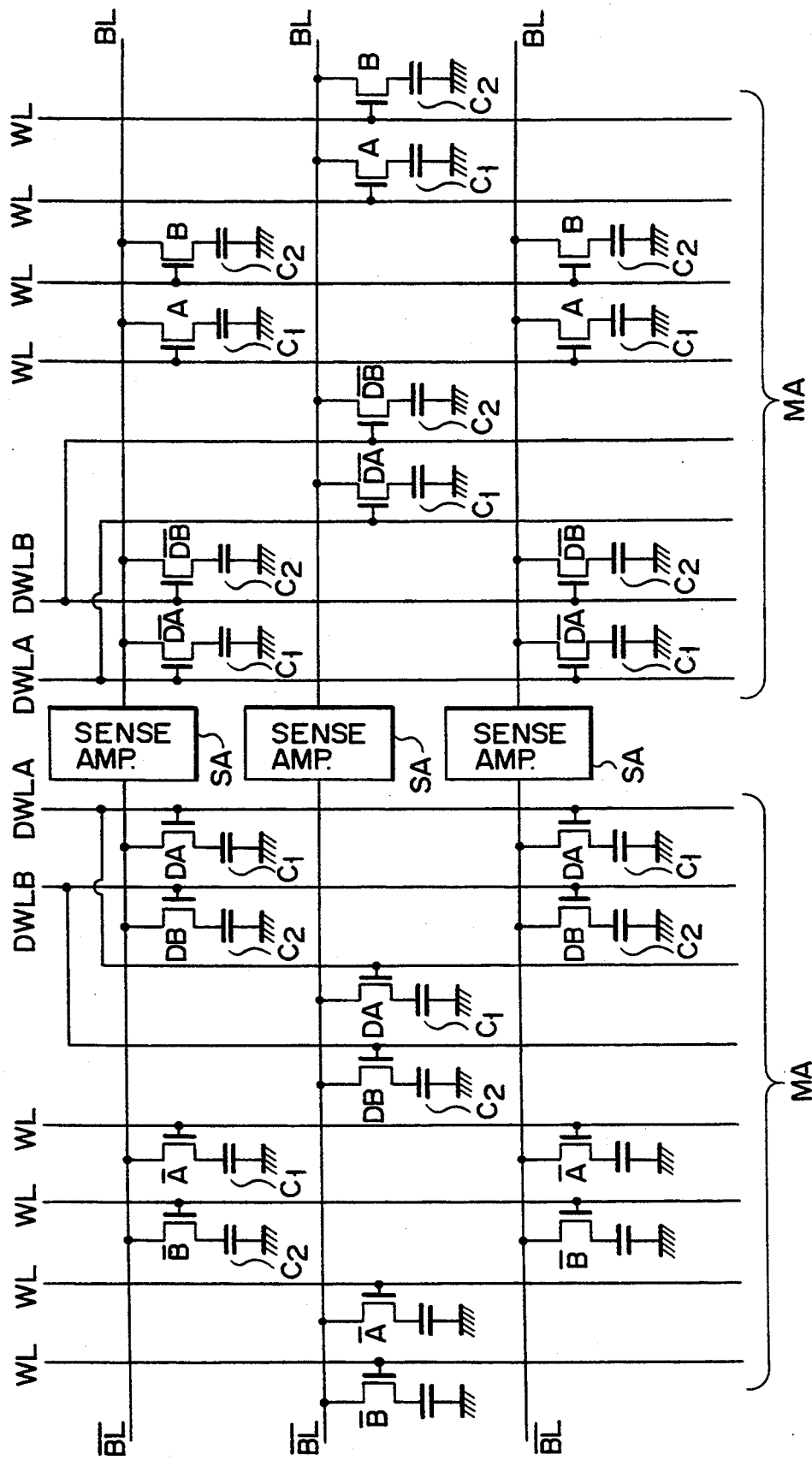
FIG. 1A is a circuit diagram showing a part of a memory cell array of a DRAM including a bit line potential read circuit according to a first embodiment of the present invention.

FIG. 1A shows part of a memory cell array of a DRAM including a bit line potential read circuit according to a first embodiment of the present invention. In FIG. 1A, SA represents a bit line sense amplifier; MA, part of a memory cell array; BL, $\overline{BL}$, a bit line pair; WL, word lines; and DWLA, DWLB, dummy word lines. In the memory cell array MA, a trench capacitor type memory cell A having a capacitor $C_1$ and stacked capacitor type memory cell B having a capacitor $C_2$ are alternately arranged for a common bit line, and the same kind of memory cells are connected to common word lines WL and dummy word lines DWLA and DWLB. In this case, two kinds of dummy cells DA and DB are used as dummy cells, which have the same structure as the trench capacitor type and stacked capacitor type the main memory cells A and B. That is, the two kinds of dummy cells DA, DB are independently connected to each bit line, and dummy word lines DWLA and DWLB are independently provided, corresponding to the two kinds of dummy cells DA and DB. The dummy cells DA and DB have capacitors $C_1$ and $C_2$, respectively. For selecting a memory cell, a select circuit arrangement is provided to select the same kind of main memory cell and the dummy cell. That is, when one of the two kinds of main memory cells, for example, a trench capacitor type main memory cell A, connected to a given bit line is selected by a given word line WL, a trench capacitor type dummy cell DA is selected by selecting one of two kinds of dummy word lines DWLA and DWLB which are located at a side of bit lines $\overline{BL}$ paired with bit lines BL. In this case, for reducing the quantity of electric charge of the capacitor $C_1$ or $C_2$ of each dummy cell to a half value of that of each main memory cell, a voltage applied to the electrode plate of the capacitor $C_1$ or $C_2$ is given by $\frac{1}{2}$ of a voltage applied to the electrode plate of the main memory cell. The sense amplifier SA detects information by comparing a potential of bit line $\overline{BL}$, that is, the quantity of electric charge (the half value of the main memory cell) read from the dummy cell, with a potential of the bit line BL, that is, the quantity of electric charge read from the main memory cell.

FIG. 2 is a view schematically showing a part of the plane pattern of the memory cell array MA shown in FIG. 1A. Trench and stacked capacitor type memory cells A and B are alternately arranged in the same direction as a common bit line BL, and the same kind of memory cells are connected to a common word line WL. The respective memory cells are arranged on a substrate in proximity so as to provide a matrix. In this case, those trench and stacked capacitor type memory cells A and B are alternately arranged in horizontal and vertical directions so that all of the memory cells adjacent to one another are given by different type memory cells. Further, these memory cells A and B are also located in such a manner that cell nodes of the trench capacitor type memory cells A are not adjacent to each other through the field insulating film. The charge storage regions of the memory cells A and B are provided so as to be adjacent to each other as shown in FIG. 3 illustrating a cross-section along a line Y-X of FIG. 2.

In FIG. 3, 30 represents a P-type silicon semiconductor substrate; A, a trench capacitor type memory cell; B, a stacked capacitor type memory cell; WL, a gate electrode (word line) formed of a polysilicon layer for a transfer gate transistor; 31, a gate insulating film formed of a silicon oxide film; and 32, a drain (N+-diffused layer) for the transfer gate transistor which is connected to the bit line (not shown) located so as to cross the word line WL. Further, 33 represents an isolation region provided by a LOCOS (Local Oxidation of Silicon) method in the semiconductor substrate and formed of a silicon oxide film for electrically isolating memory cells from one another; 34, an interlevel insulator provided on the gate electrode and formed of a silicon oxide film; and 35, the charge storage region of the stacked capacitor type memory cell B which is formed of polysilicon film (N-type polysilicon doped with phosphorus) provided on the portions of the gate electrode and the isolation region and which is connected to a source 36 of the transfer gate transistor of the stacked capacitor type memory cell B. Reference numeral 37 represents the charge storage region of the trench capacitor type memory cell A, which is provided by an N-type diffused layer formed in a trench of the semiconductor substrate and which is connected to a source 38 of the transfer gate transistor of the trench capacitor type memory cell A. Reference numeral 39 represents one electrode plate paired with the charge storage regions 35 and 37, which is formed of a thin polysilicon film (N+-type polysilicon doped with phosphorus) and which continuously extends above the charge storage region 35 of the stacked capacitor type memory cell B through an insulating film 40 of silicon oxide. The trench formed in the semiconductor substrate is filled with a silicon oxide film 41, by LPCVD techniques, and the silicon oxide film 41 is then planarized. An interlevel insulator (not shown) is provided on the trench and stacked capacitor type memory cells A and B. After contact holes formed in the interlevel insulator, aluminum interconnection layers are provided to complete interconnects associated with bit lines and word lines to be connected to peripheral circuits (not shown).

According to the memory cell array of the DRAM of the first embodiment wherein two kinds of the memory cells are connected to every bit line and one kind of memory cells are connected to every word line or dummy word line, even if a potential read from the bit line BL is changed depending upon the different discharge characteristic and quantity of stored charge rendered by the different type charge storage regions, the same dummy cell as the main memory cell will be selected by switching and selecting two-party-line system dummy word lines when a different type memory cell is read out. Therefore, it will be possible to accurately read corresponding information.

In the arrangement shown in FIG. 1A, dummy memory cells DA and DB having the same structure as the two kinds of main memory cells A and B are connected to the common bit lines (BL, $\overline{BL}$), and the voltage applied to the electrode plate of each dummy cell DA and DB is given by $(\frac{1}{2})\cdot V$ of the voltage V applied to the electrode plate of each main memory cell, thereby rendering half the quantity of electric charge of each main memory cell to each dummy cell. At any rate, the semiconductor memory device may require four dummy cells DA and DB corresponding to main memory cells A and B.

Figure 1B:
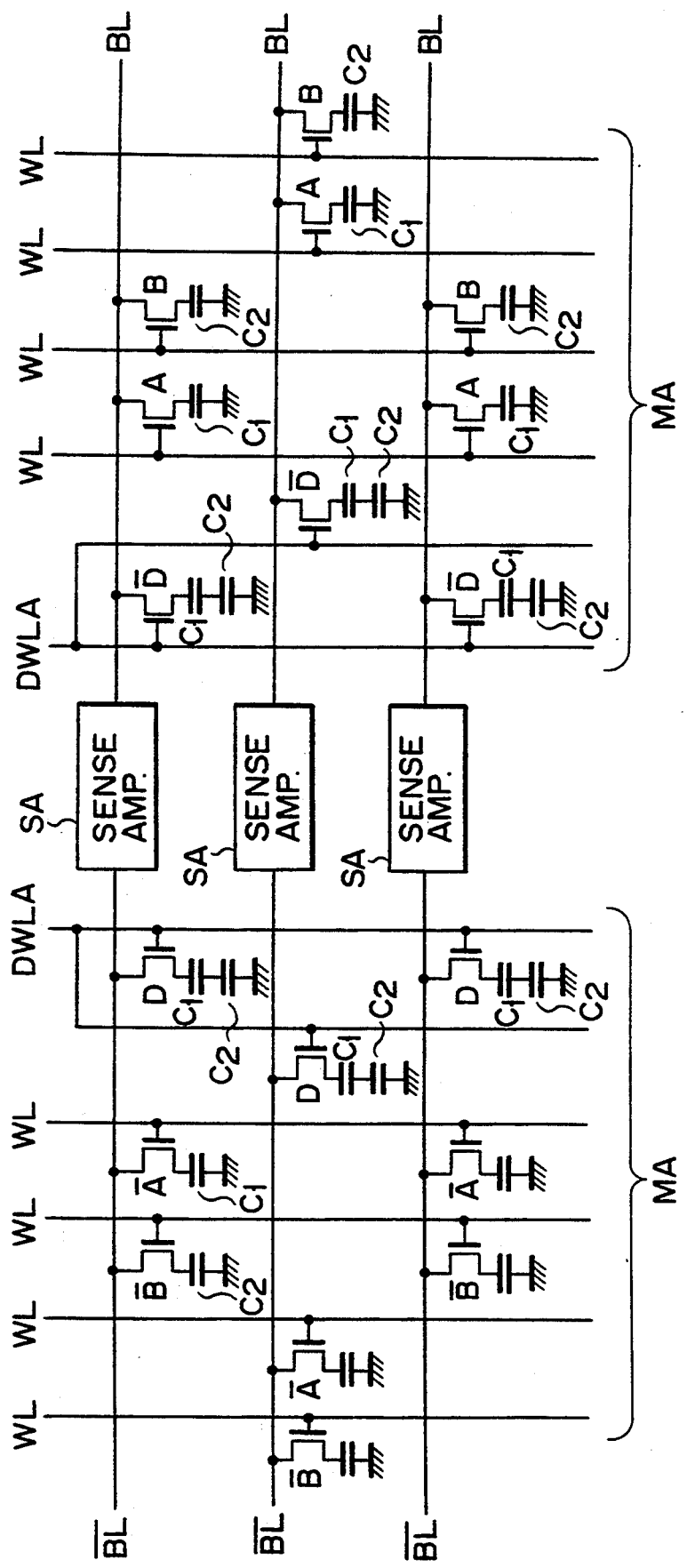
FIG. 1B is a circuit diagram showing a part of a memory cell array of a DRAM including a bit line potential read circuit according to a second embodiment of the present invention.

FIG. 1B shows a memory cell array including a bit line potential read circuit according to a second embodiment of the present invention. In the memory cell array, one dummy cell D, which includes two capacitors $C_1$ and $C_2$ equivalently connected in series instead of dummy cells DA and DB, is connected to each of bit lines BL and $\overline{BL}$. In this case, the dummy cell D has the same structure as either one of main memory cells A and B, for example. The main memory cell A, and the capacitance values of capacitors $C_1$ and $C_2$ are substantially equal to those of the capacitors of the main memory cells A and B. Therefore, the total capacitance value of the series-connected capacitors $C_1$ and $C_2$ becomes substantially $(C_1+C_2)/2$. Thus, the quantity of electric charge of each dummy cell D becomes one-half that of the main memory cell A or B. Accordingly, even if a potential read from the bit line BL is changed depending upon the different discharge characteristic and quantity of stored charge rendered by the different type charge storage regions, the information will be accurately read by selecting the dummy cell of dummy word line DWLA and the main memory cell of the word line WL.

Figure 4:
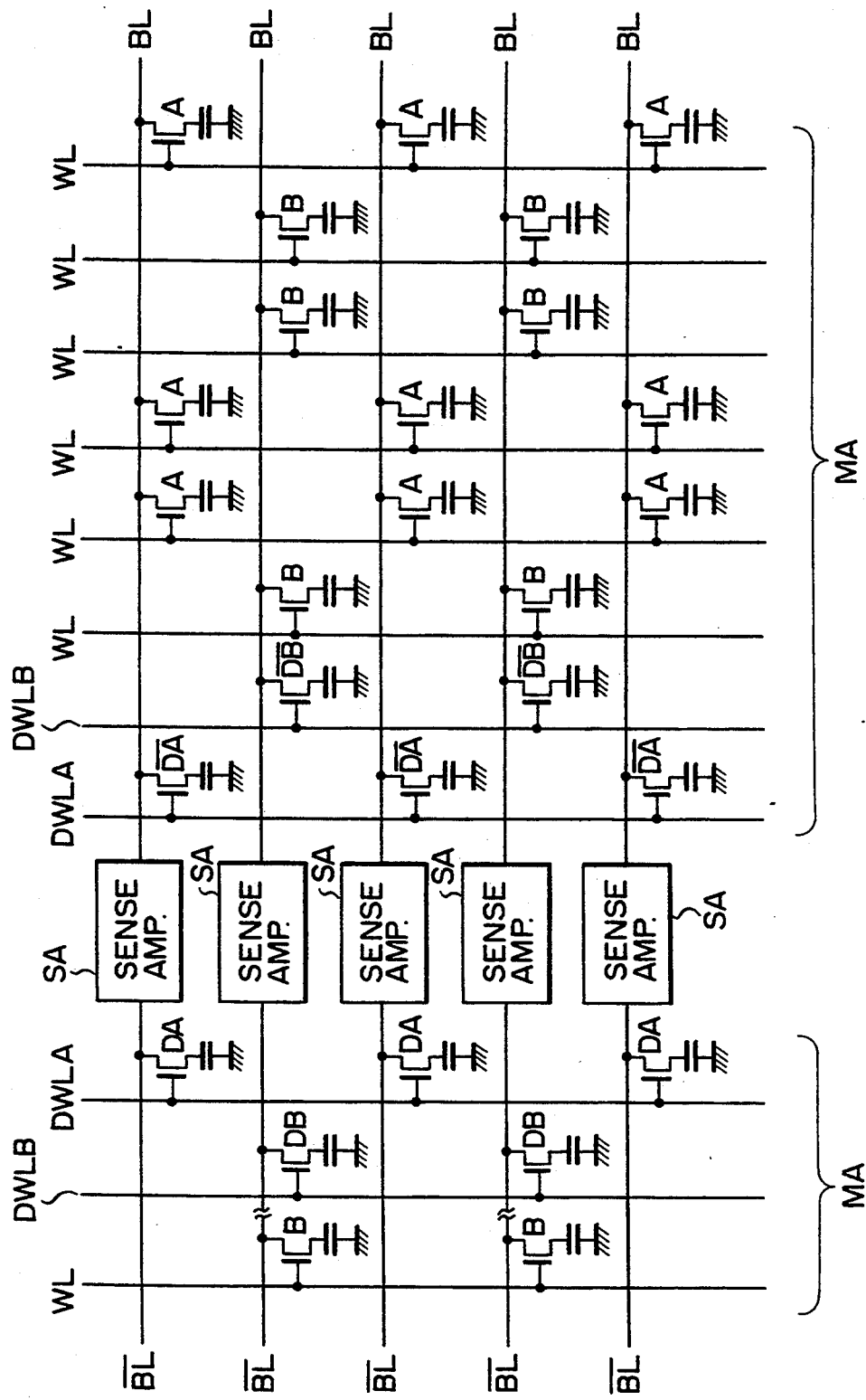
FIG. 4 is a circuit diagram showing a part of a memory cell array of a DRAM including a bit line potential read circuit according to a third embodiment of the present invention.
Figure 6:
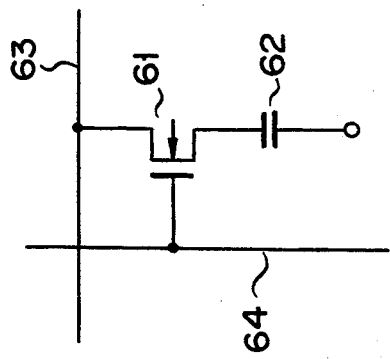
FIG. 6 is an equivalent circuit of a memory cell in DRAM.

FIG. 4 shows schematically a part of a memory cell array including a bit line potential read circuit of a DRAM according to a third embodiment of the present invention. In the drawing, SA represents a bit line sense amplifier; MA, a part of a memory cell array; BL and $\overline{BL}$, a bit line pair; WL, a word line; and DWLA and DWLB, dummy word lines, respectively. In the memory cell array MA, the same kind of memory cells, that is, trench capacitor type memory cells A or stacked capacitor type memory cells B are connected to a common bit line, and the same kind of memory cells are connected to a common word line WL or dummy word lines DWLA, DWLB. In addition, the different kind of memory cells are connected to every adjacent bit lines (the type of the memory cells is changed for every bit line). In this case, dummy cells DA and DB have the same structures as those of main memory cells A and B, respectively, and one kind of dummy cell having the same type as that of the main memory cell is connected to each of bit lines. For selecting any one of main memory cells, one main memory cell and one dummy cell these having the same type are selected. That is, when one of main memory cells connected to one bit line BL is to be selected, one dummy cell having the same type as that of the main memory cell is selected from the dummy word line DWLB arranged at the bit line $\overline{BL}$ paired with that bit line BL. In this case, for reducing the quantity of electric charge of the dummy cell to half the quantity of electric charge of the main memory cell, a voltage applied to the electrode plate of the dummy cell is reduced to ½ of a voltage applied to the electrode plate of the main memory cell. The sense amplifier SA detects information by comparing a potential on the bit line BL, which is read out as the quantity of electric charge stored in the main memory cell, with a potential on the bit line $\overline{BL}$ which is read out as the quantity of electric charge (a half value of the main memory cell) stored in the dummy cell.

Figure 5:
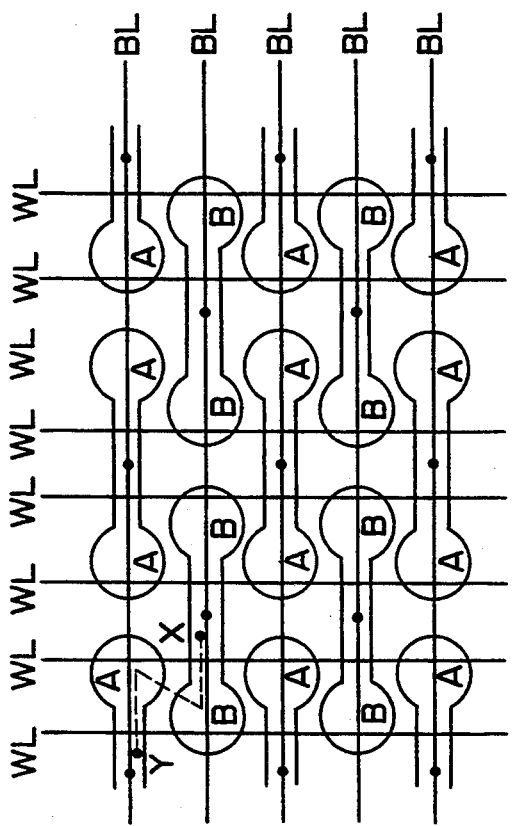
FIG. 5 is a view schematically showing a part of a plane pattern of the memory cell array as shown in FIG. 4.
Figure 7:
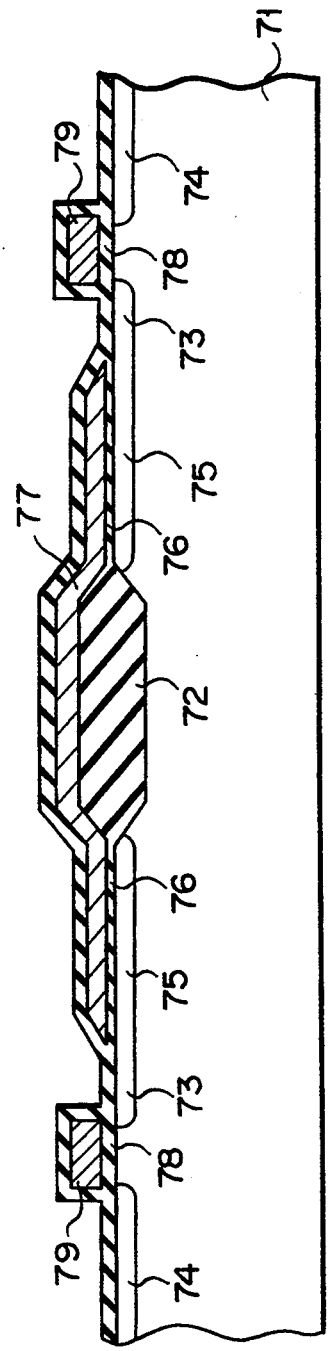
FIG. 7 is a cross-sectional view showing a conventional planar capacitor type memory cell.
Figure 8:
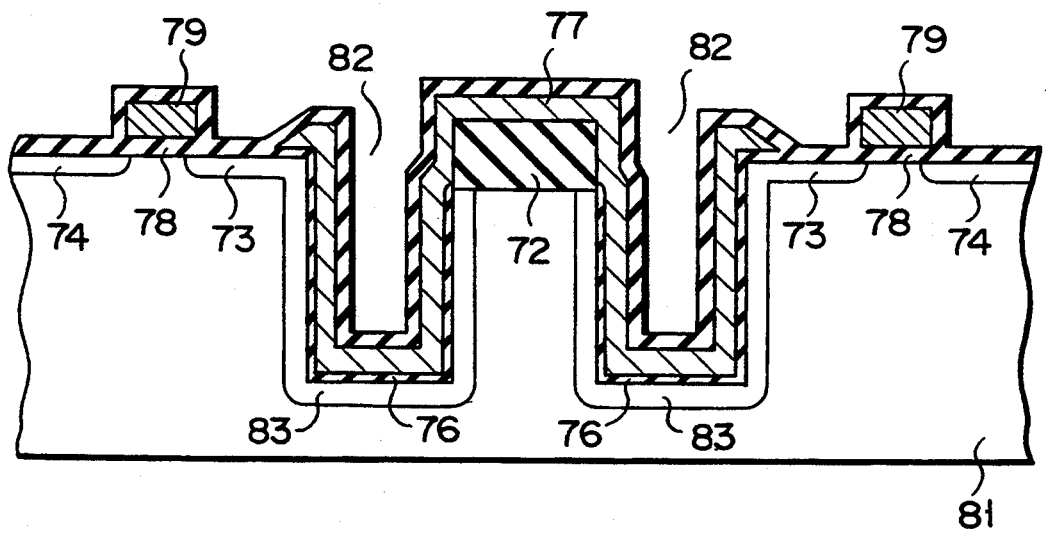
FIG. 8 is a cross-sectional view showing a conventional stacked capacitor type memory cell.
Figure 9:
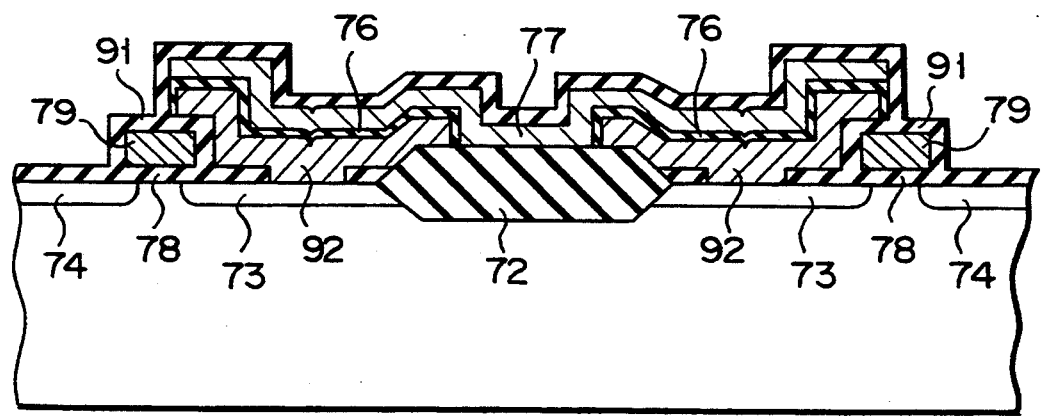
FIG. 9 is a cross-sectional view showing a conventional trench capacitor type.

FIG. 5 is a view schematically showing a part of a plane pattern of the memory cell array of FIG. 4. In the drawing, one kind of trench capacitor type memory cells A and stacked capacitor type memory cells B are arranged in a direction of a common bit line BL, and the memory cells with the different type are alternately located for every adjacent bit line BL. Further, the memory cells of the same type are connected to a common word line WL, and the memory cells are located on the substrate in proximity so as to provide a matrix. In the arrangement, the cell nodes of the trench capacitor type memory cells A are arranged so as to be adjacent to one another through a field insulating film, and the memory cells are also provided so that the charge storage regions of the trench capacitor type memory cells A and stacked capacitor type memory cell B are oppositely adjacent to each other as shown in the cross-section of FIG. 3.

In the DRAM according to the third embodiment of the present invention, the memory cell array is provided in which the memory cells with the same type are arranged in the direction of the common bit line BL and the memory cells with the different type are connected to the adjacent bit line. Since the different charge storage regions of the trench capacitor type memory cell A and stacked capacitor type memory cell B can be arranged in proximity, even if those of the adjacent memory cells are placed in the horizontal direction with respect to the substrate surface, desired spacing between charge storage regions can be provided in a direction perpendicular to the substrate surface. Therefore, the quantity of electric charge moving between the charge storage regions through the insulating film or the substrate can be decreased, and the movement of such electric charge may become theoretically zero or very low. Further, respective charge storage regions can be provided without depending upon the limit of fine patterning as compared with the conventional memory cell array. By continuously providing electrode plates of the adjacent trench and stacked capacitor type memory cells, their spacing can be made minimum from the stractural viewpoint and, in actual practice, the respective charge storage regions can be formed by self-alignment techniques.

Figure 10:
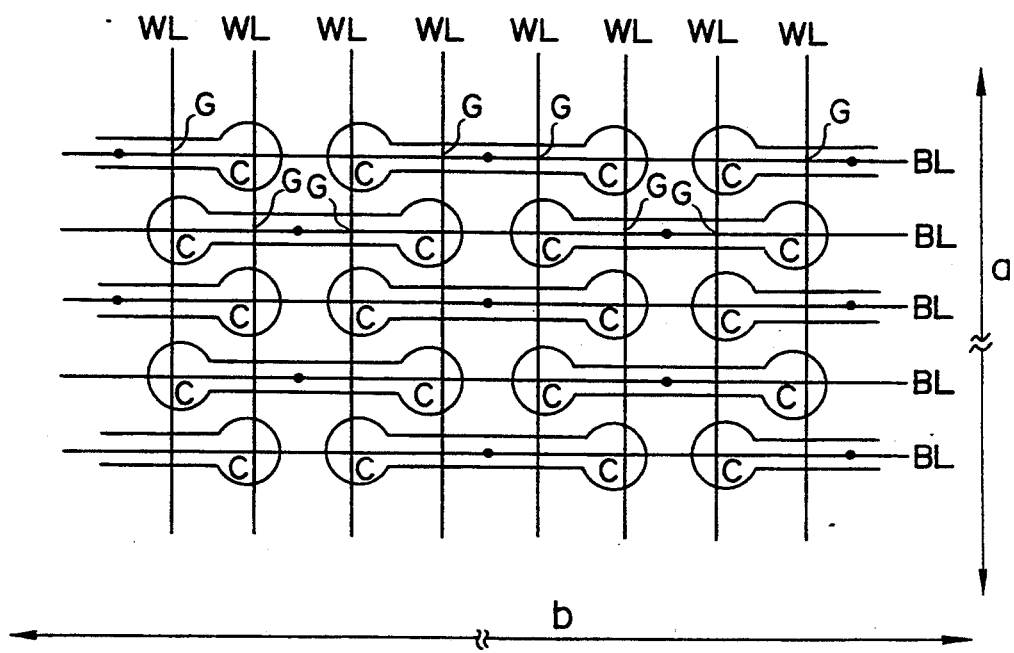
FIGS. 10 to 12 are views schematically showing a plane pattern of a memory cell array of a conventional DRAM, respectively.
Figure 11:
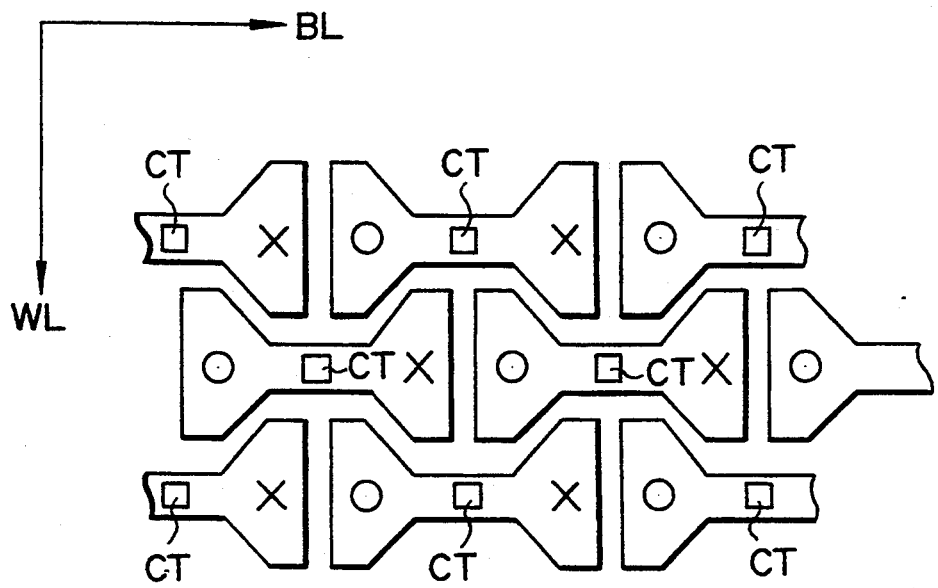
Figure 12:
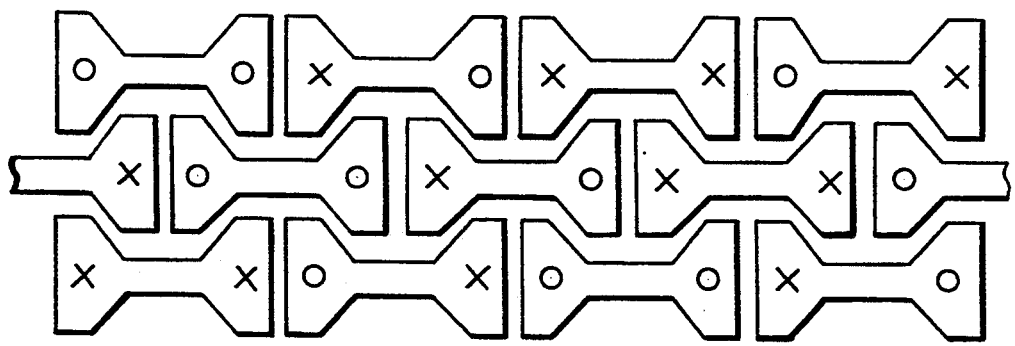

Now, if a length in the word line direction, a length in the bit line direction, the number of the word lines and the number of the bit lines are given by a($\mu$m), b($\mu$m) Nw and Nb, respectively, in the conventional memory cell array including the same type memory cells as shown in FIG. 10, the length in the bit line direction may be reduced by $$\Delta b1 = 0.5 \times Nw/2 \ (\mu m)$$

and the area of the memory cell array may be reduced by $$\Delta S1 = a \times \Delta b1 \ (\mu m^2)$$

as compared with the conventional structure when the arrangement of the memory cells according to the present invention is located as shown in FIG. 5.

Further, when the adjacent memory cells in the memory cell are arranged as shown in FIG. 2, the length in the bit line direction may be reduced by $$\Delta b2 = 0.5 \times Nw/2 \ (\mu m)$$

and the area of the memory cell array may also be reduced by $$\Delta S2 = a \times (\Delta b1 + \Delta b2) \ (\mu m^2).$$

Now assume, for example, a 4M-bit DRAM where
the number of word lines and that of bit lines per unit length are given by 430 lines/mm and 400 lines/mm,
the dimension of the word line direction and that of the bit line direction in the memory cell array are given by 3 mm and 10 mm, and
the area of the memory cell array is given by $S(=3000 \times 10000 \ \mu m^2)$.

Then, the reduced area in the memory cell array shown in FIG. 5 may be given by $$\begin{aligned}
\Delta S1/S &= (a \times \Delta b1)/(a \times b) \\
&= (a \times 0.5 \times Nw/2)/(a \times b) \\
&= (3000 \times 0.5 \times 4300/2)/(3000 \times 10000) \\
&= 0.1075, \text{ that is, about } 1\tfrac{1}{2}\%.
\end{aligned}$$

And the reduced area in the memory cell array shown in FIG. 2 may be also given by $$\begin{aligned}
\Delta S2/S &= [a \times (\Delta b1 + \Delta b2)]/(a \times b) \\
&= [a \times (0.5 \times Nw/2 + 0.5 \times Mw/2)]/(a \times b) \\
&= [3000 \times (0.5 \times 4300/2 + 0.5 \times 4300/2)]/ \\
&\quad (3000 \times 10000) \\
&= 0.215, \text{ that is, about } 22\%.
\end{aligned}$$

For alleviating a load for peripheral circuits, it may be preferable that a difference in capacitance between the charge storage regions of the trench capacitor type memory cell A and stacked capacitor type memory cell B be set to below 10% of the total capacitance value of them.

In the DRAM of the third embodiment, even if the memory cells cannot be arranged closer to one another than those different type memory cells arranged in the common bit line as shown in FIG. 2, it may be possible to achieve the proximity arrangement of the memory cells which is not provided by the arrangement of the conventional memory cell array rendered by the same type memory cells as shown in FIG. 10. Accordingly, memory cell arrays with the high integration density will be realized to provide DRAMs having the high integration density. Further, since only one kind of the main memory cells and dummy cells are connected to the common bit line, one dummy cell having the same type as a desired main memory cell may be selected by selecting the dummy cell connected to the paired bit line when information is read from the main memory cell connected to the bit line. Therefore, information will be accurately detected, and it will be easy to select the dummy cell.

Although the present invention has been described in conjunction with the trench and stacked capacitor type memory cells, it will be apparent that the advantages of the present invention can be achieved by combining several kinds of memory cells having different charge storage regions.

It is further understood by those skilled in the art that the foregoing description is a preferred embodiments of the disclosed device and that various changes and modifications may be made in the invention without departing from the spirit and scope thereof.

What is claimed is:

1. A dynamic type semiconductor memory device comprising:
   a plurality of bit lines extending in a first direction;
   a plurality of word lines extending in a second direction so as to intersect said bit lines;
   first and second dummy word lines extending in said second direction so as to intersect said bit lines; and
   a memory cell array including first memory cells, each having a trench capacitor; second memory cells, each having a stacked capacitor; first dummy cells, each having a trench capacitor; and second dummy cells, each having a stacked capacitor;
   one of said first memory cells and one of said second memory cells being coupled to each of said bit lines, and one of said first dummy cells and one of said second dummy cells being coupled to each of said bit lines;
   said first memory cells being coupled to one of said word lines, and said second memory cells being coupled to adjacent another of said word lines;
   said first and second dummy cells being coupled to said first and second dummy word lines, respectively; and
   wherein, when one of said first and second memory cells is selected, a corresponding one of said first and second dummy cells is selected.

2. The dynamic type semiconductor memory device according to claim 1, wherein one of said first memory cells and one of said second memory cells are alternatively coupled to each of said bit lines.

3. The dynamic type semiconductor memory device according to claim 1, wherein each of said first and second dummy cells has substantially the same structure as that of said first and second memory cells, respectively.

4. The dynamic type semiconductor memory device according to claim 1, wherein each of said first and second dummy cells is operated by a half voltage of a voltage applied to each of said first and second memory cells to substantially reduce the charge to half.

5. A dynamic type semiconductor memory device comprising:
   a plurality of bit lines extending in a first direction;
   a plurality of word lines extending in a second direction so as to intersect said bit lines;
   a dummy word line extending in said second direction so as to intersect said bit lines; and
   a memory cell array including first memory cells, each having a trench capacitor; second memory cells, each having a stacked capacitor; and a plurality of dummy cells, each having a trench capacitor and a stacked capacitor connected in series with each other;
   one of said first memory cells and one of said second memory cells being coupled to each of said bit lines, and one of said dummy cells being coupled to each of said bit lines;
   said first memory cells being coupled to one of said word lines, and said second memory cells being coupled to adjacent another of said word lines;
   each of said dummy cells being coupled to said dummy word line; and
   wherein when one of said first and second memory cells is selected, one of said dummy cells is selected.

6. The dynamic type semiconductor memory device according to claim 5, wherein one of said first memory cells and one of said second memory cells are alternately coupled to each of said bit lines.

7. The dynamic type semiconductor memory device according to claim 5, wherein each of said dummy cells has substantially a half capacitance of a capacitance given by each of said first and second memory cells.

8. A dynamic type semiconductor memory device comprising:
   a plurality of bit lines extending in a first direction;
   a plurality of word lines extending in a second direction so as to intersect said bit lines;
   first and second dummy word lines extending in said second direction so as to intersect said bit lines; and
   a memory cell array including first memory cells, each having a trench capacitor; second memory cells, each having a stacked capacitor; first dummy cells, each having a trench capacitor; and second dummy cells, each having a stacked capacitor;
   one of said first memory cells and one of said first dummy cells being coupled to one of said bit lines, and one of said second memory cells and one of said second dummy cells being coupled to adjacent another of said bit lines;
   said first memory cells being coupled to one of said word lines, and said second memory cells being coupled to adjacent another of said word lines;
   said first and second dummy cells being coupled to said first and second dummy word lines, respectively; and
   wherein when one of said first and second memory cells is selected, a corresponding one of said first and second dummy cells is selected.

9. The dynamic type semiconductor memory device according to claim 8, wherein each of said first and second dummy cells has substantially the same structure as that of said first and second memory cells, respectively.

10. The dynamic type semiconductor memory device according to claim 8, wherein each of said first and second dummy cells is operated by half voltage of a voltage applied to each of said first and second memory cells to substantially reduce the charge to half.

* * * * *

UNITED STATES PATENT AND TRADEMARK OFFICE
CERTIFICATE OF CORRECTION

PATENT NO. : 5,410,509
DATED : April 25, 1995
INVENTOR(S) : Shigeru MORITA

It is certified that error appears in the above-indentified patent and that said Letters Patent is hereby corrected as shown below:

On the title page, before item [57] Abstract, the Attorney, Agent, or Firm, Front Page, Line 2, change "&" (First Occurrence) to --,--.

Signed and Sealed this

Seventeenth Day of October, 1995

Attest:

BRUCE LEHMAN

Attesting Officer

Commissioner of Patents and Trademarks